(12) United States Patent
Katzman et al.

(10) Patent No.: US 7,688,112 B2
(45) Date of Patent: Mar. 30, 2010

(54) ANTI-SEE PROTECTION TECHNIQUES FOR HIGH-SPEED ICS WITH A CURRENT-SWITCHING ARCHITECTURE

(75) Inventors: Vladimir Katzman, Rancho Palos Verdes, CA (US); Vladimir Bratov, Culver City, CA (US)

(73) Assignee: Advanced Science & Novel Technology, Rancho Palos Verdes, CA (US)

( * ) Notice: Subject to any disclaimer, the term of this patent is extended or adjusted under 35 U.S.C. 154(b) by 366 days.

(21) Appl. No.: 11/610,052

(22) Filed: Dec. 13, 2006

(65) Prior Publication Data

US 2008/0143374 A1    Jun. 19, 2008

(51) Int. Cl.
*H03K 19/0175* (2006.01)
*H03K 19/003* (2006.01)
*H03K 5/22* (2006.01)

(52) U.S. Cl. .............................. 326/82; 326/9; 327/67; 327/563

(58) Field of Classification Search ........................ None
See application file for complete search history.

(56) References Cited

U.S. PATENT DOCUMENTS

| | | | | |
|---|---|---|---|---|
| 4,918,336 | A * | 4/1990 | Graham et al. .............. | 326/117 |
| 5,311,070 | A | 5/1994 | Dooley | |
| 5,600,260 | A | 2/1997 | LaMacchia et al. | |
| 6,127,864 | A | 10/2000 | Mavis et al. | |
| 6,667,520 | B1 | 12/2003 | Fulkerson | |
| 6,744,308 | B1 * | 6/2004 | Beumer ....................... | 327/563 |
| 7,372,317 | B1 * | 5/2008 | Gerstenhaber et al. ...... | 327/535 |
| 2006/0220733 | A1 * | 10/2006 | Hwang et al. ............... | 327/543 |
| 2008/0174356 | A1 * | 7/2008 | Yamamoto et al. .......... | 327/362 |

OTHER PUBLICATIONS

Guofu Niu et al., "A Comparison of SEU Tolerance in High-Speed SiGe HBT Digital Logic Designed With Multiple Circuit Architectures", IEEE Transactions on Nuclear Science, vol. 49, No. 6, Dec. 2002, pp. 3107-3114.
T. Calin et al., "Upset Hardened Memory Design for Submicron CMOS Technology", IEEE Transactions on Nuclear Science, vol. 43, No. 6, Dec. 1996, pp. 2874-2878.
R. Katz et al., "SEU Hardening of Field Programmable Gate Arrays (FPGAS) For Space Applications and Device Characterization", IEEE Transactions on Nuclear Science, vol. 41, No. 6, Dec. 1994, pp. 2179-2186.
R. Krithivasan et al., "Application of RHBD Techniques to SEU Hardening of Third-Generation SiGe HBT Logic Circuits", IEEE Transactions on Nuclear Science, vol. 53, No. 6, Dec. 2006, pp. 3400-3407.
P. W. Marshall et al., "Single Event Effects in Circuit-Hardened SiGe HBT Logic at Gigabit per Second Data Rates", IEEE Transactions on Nuclear Science, vol. 47, No. 6, Dec. 2000, pp. 2669-2674.

* cited by examiner

*Primary Examiner*—Vibol Tan
*Assistant Examiner*—Dylan White
(74) *Attorney, Agent, or Firm*—Schiff Hardin LLP

(57) ABSTRACT

Protection against anti single event effects associated with strikes of energetic particles is provided in current-mode logic (CML) or similar integrated circuits (ICs) using a current-switching architecture.

24 Claims, 5 Drawing Sheets

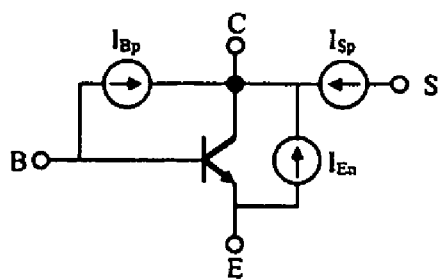
*Fig. 1. A Model of SEE in an HBT*
(Prior Art)
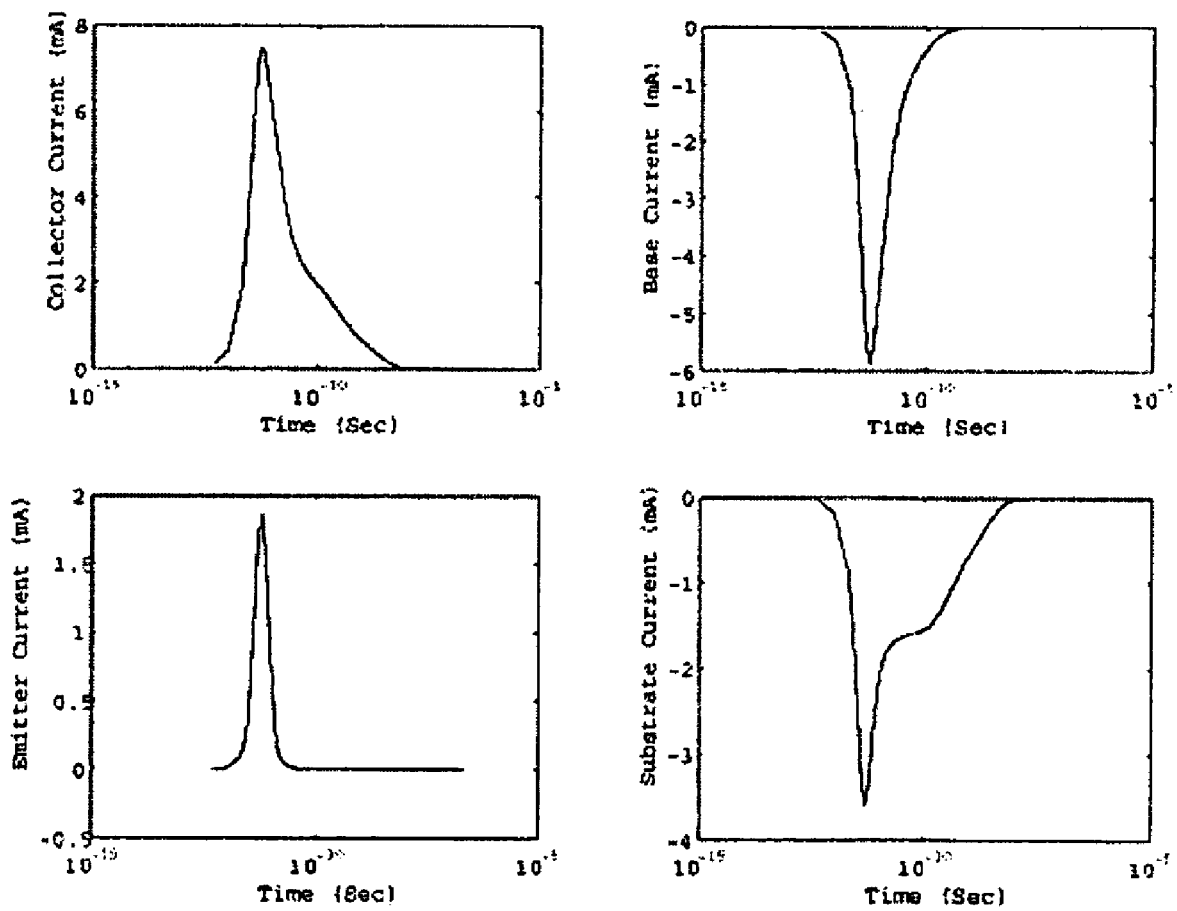
*Fig. 2. Simulated Current Pulses*
(Prior Art)

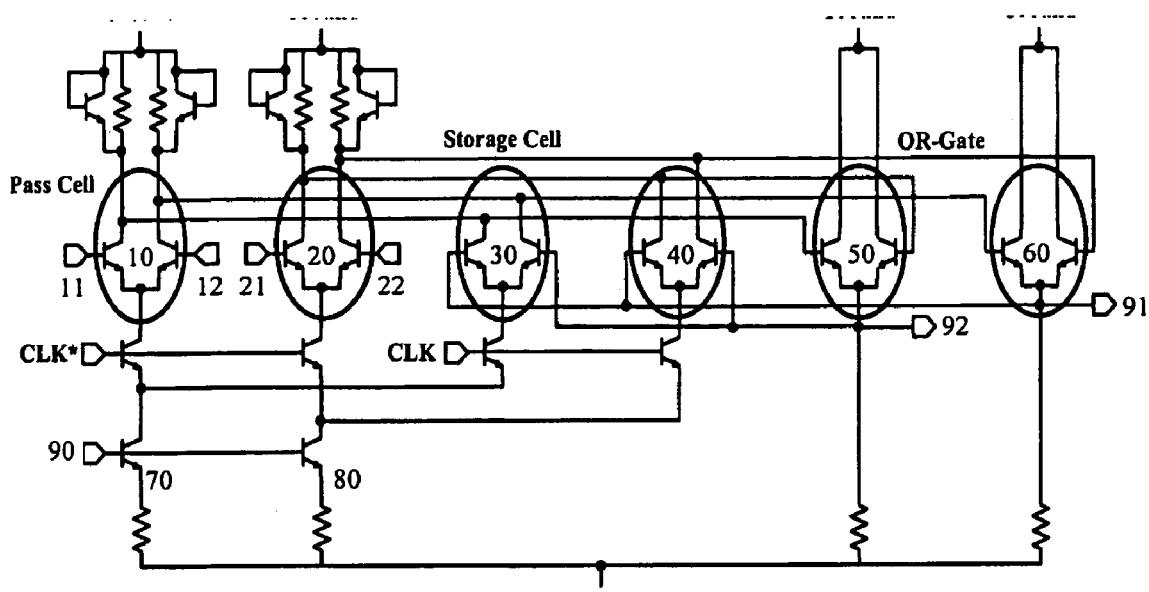
Fig. 3. Gated Feedback Technique
(Prior Art)
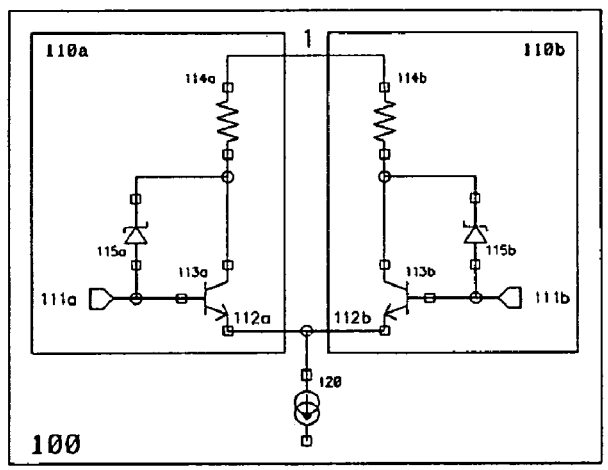
Fig. 4. Schematic of the ASP Dual Emitter Follower.
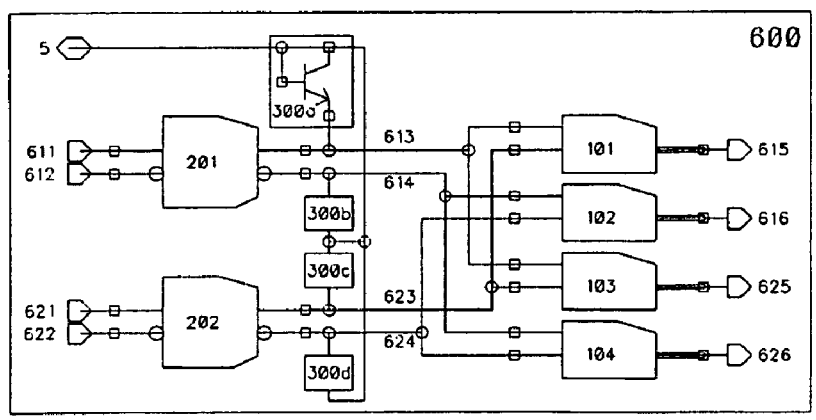
Fig. 5. Architecture of the ASP CML Buffer for the Bottom-Level CML Signals.

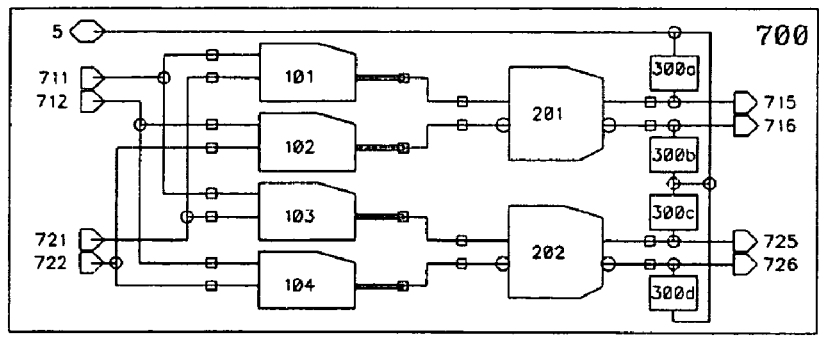
Fig. 6. Architecture of the ASP CML Buffer for the Top-Level CML Signals.
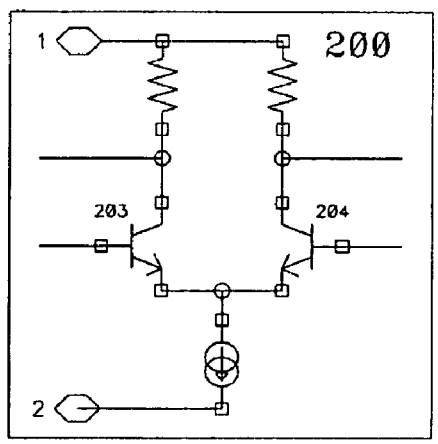
Fig. 7. Schematic of a Standard CML Buffer.
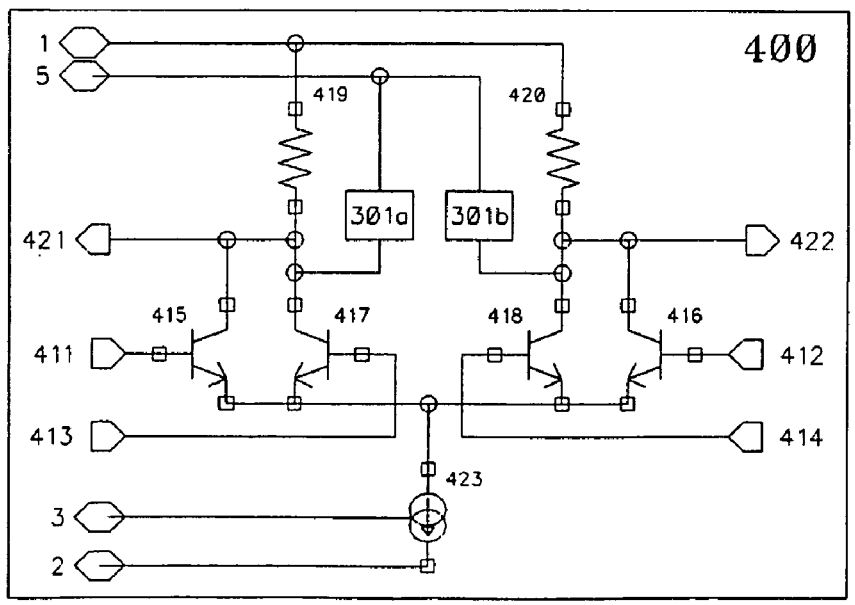
Fig. 8. Schematic of the SDR Dual Current Switch.

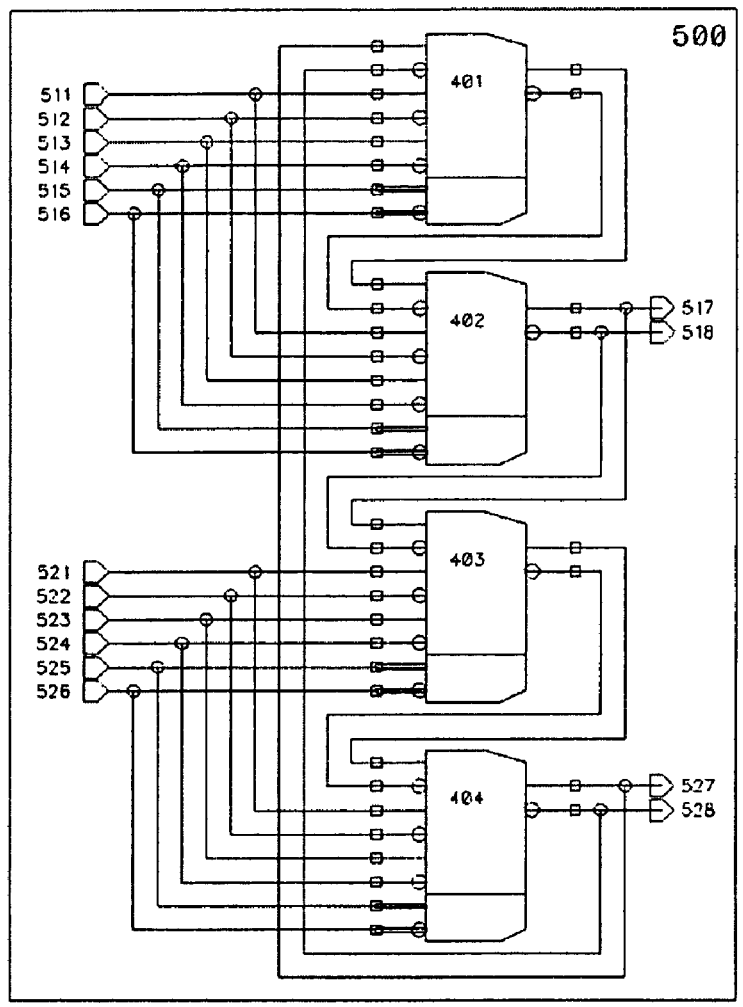
Fig. 9. Architecture of the ASP CML Logic Stage.
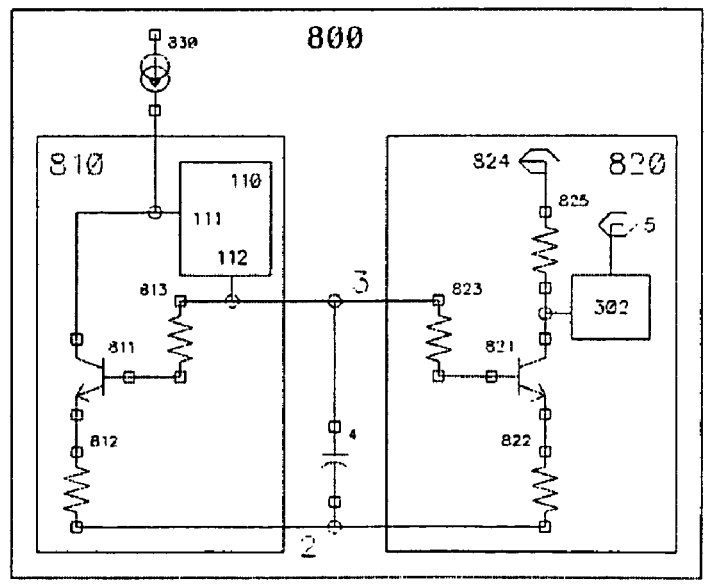
Fig. 10. Schematic of the ASP n-p-n Current Mirror.

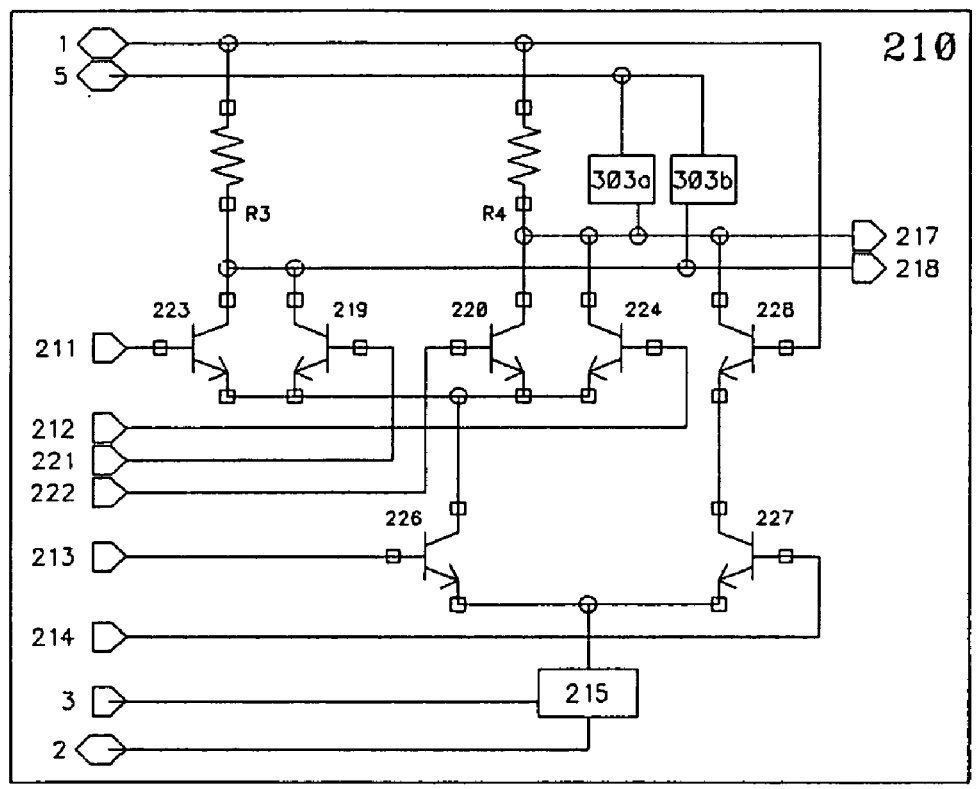
Fig. 11. Schematic of the SDR AND Cell.
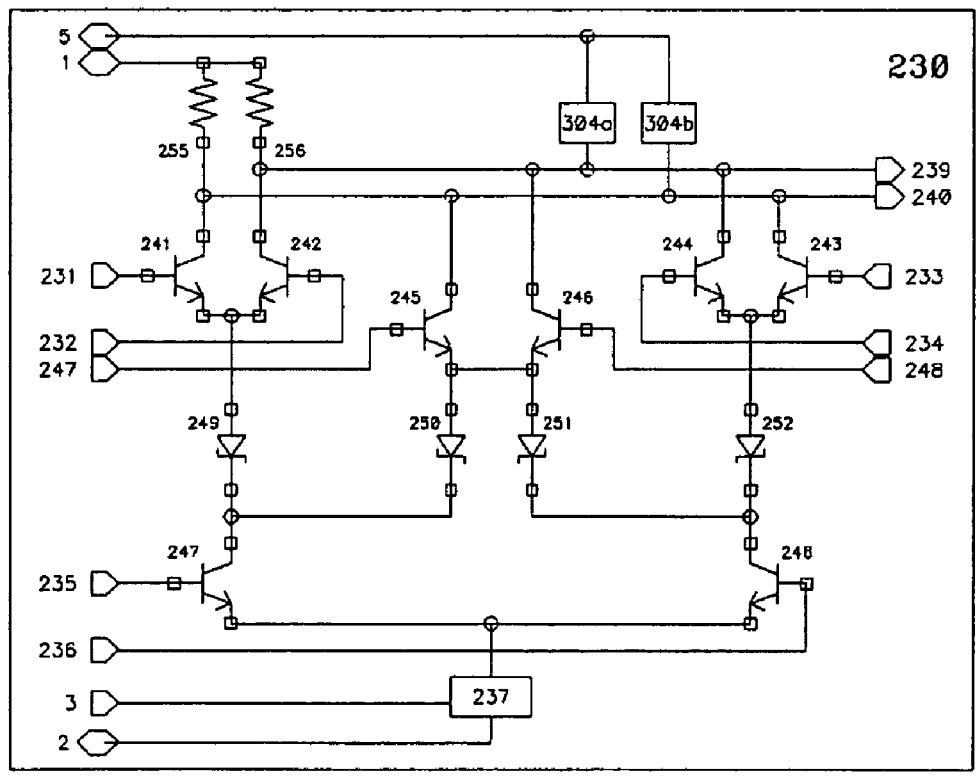
Fig. 12. Schematic of the SDR 2-to-1 Multiplexer Cell.

ANTI-SEE PROTECTION TECHNIQUES FOR HIGH-SPEED ICS WITH A CURRENT-SWITCHING ARCHITECTURE

TECHNICAL FIELD

The present application relates to high-speed data processing equipment that is capable of operating properly when subjected to radiation from natural and/or artificial sources. Such data processing equipment, for example, may include space-oriented electronics, deep sub-micron electronics, special equipment, etc.

BACKGROUND

Anti-SEE (single event effect) protection is vital for integrated circuits (ICs) such as those operating in outer space, and is becoming critical for ground-based circuits due to increasing miniaturization of their components. In integrated circuits (ICs) such as current-mode logic (CML) and similar ICs with a current-switching architecture, single-event effects (SEE) are associated with strikes of energetic particles. These strikes cause an electric charge to be generated in the IC's regions resulting in the appearance of short current pulses flowing into the heterojunction bipolar transistor's (HBT) collector node and out of its base, emitter, and substrate nodes.

FIG. 1 shows a model of a SEE in a heterojunction bipolar transistor (HBT) derived from G. Niu, R. Krithivasan, J. Cressler et al., "*A Comparison of SEU Tolerance in High-Speed SiGe HBT Digital Logic Designed with Multiple Circuit Architectures,*" IEEE Trans. On Nuclear Science, v. 49, No. 6, December 2002, pp. 3107-3114. The equivalent circuit shown in FIG. 1 describes three independent current sources $i_{Bp}$, $i_{Sp}$, and $i_{En}$, which represent SEE-induced transient current pulses through the base, substrate, and emitter nodes correspondingly. The SEE-induced collector current $i_{Cn}$ is then given by $i_{Cn}=-(i_{Bp}+i_{Sp}+i_{Rn})$.

A computer simulation of these current pulses in a silicon germanium (SiGe) HBT with a 0.2×0.72 µm$^2$ emitter area for a linear energy transfer (LET)=20 pC/µm is shown in FIG. 2. As can be seen, the collector and emitter currents run into the nodes, while the base and emitter currents are reversed. It is important to note that the collector current pulse is significantly higher than the base current pulse. Assuming a certain resistive termination at the collector, emitter, and base nodes, the described behavior results in a lower collector node voltage and a higher base node voltage. The changes in the emitter node voltage depend on the actual termination scheme.

There exist several techniques for anti-SEE protection including (i) triple majority voting described by R. Katz, R. Barto, P. McKerracher, B. Carkhuff, and R. Koga, in "*SEU Hardening of Field Programmable Gate Arrays for Space Applications and Device Characterization*" (unabridged version), IEEE Transactions on Nuclear Science, NS-41, pp. 2179-2186, July 1994, and by David Fulkerson, in "SEU Hard Majority Voter for Triple Redundancy", U.S. Pat. No. 6,667,520, Dec. 23, 2003, (ii) a dual interleave cell (DICE) architecture described by T. Calin, M. Nicolaidis, and R. Velazco, in "*Upset hardened memory design for submicron CMOS technology,*" IEEE Trans. Nucl. Sci., vol. 43, pp. 2345-2352, December 1996, and by Jerry Dooley, in "*SEU-Immune Latch for Gate Array, Standard Cell, and other ASIC Applications,*" U.S. Pat. No. 5,311,070, May 10, 1994, (iii) a temporal latch architecture described by D. G. Mavis and P. H. Eaton, in "Temporally Redundant Latch for Preventing Single Event Disruptions in Sequential Integrated Circuits," U.S. Pat. No. 6,127,864, October 2000., (iv) a current-sharing architecture described by M. P. LaMacchia and W. O. Mathes, in "*SEU Hardening Approach for High Speed Logic,*" U.S. Pat. No. 5,600,260, and by Paul W. Marshall, Martin A. Carts, Arthur Campbell, Dale McMorrow, Steve Buchner, Ryan Stewart, Barbara Randall, Barry Gilbert, and Robert A. Reed, in "*Single Event Effects in Circuit-Hardened SiGe HBT Logic at Gigabit per Second Data Rates,*" IEEE Transactions on Nuclear Science, vol. 47, No. 6, December 2000, pp. 2669-2674, and (v) a gated feedback latch architecture described by Ramkumar Krithivasan et al., in "*Application of RHBD Techniques to SEU Hardening of Third-Generation SiGe HBT Logic Circuits,*" IEEE NSREC, Ponte Vedra Beach, Fla.; Jul. 17-21, 2006.

Only the last two architectures are really suitable for very high-speed applications based on HBTs. It has been shown by G. Niu, R. Krithivasan, J. Cressler et al. cited above that a current-sharing architecture cannot provide the required Anti-SEE protection (ASP) in CML latches. CML latches are the most commonly used cells in digital designs. Thus, a current-sharing architecture cannot be considered a universal approach to the protection of CML cells.

In some respects, the gated feedback latch architecture shown in FIG. 3 is arguably the closest approach to the techniques proposed herein. The latch comprises two pass cells 10 and 20, two storage cells 30 and 40, and two OR gates 50 and 60 implemented as emitter followers. The two pass cells 10 and 20 have two differential data inputs 11/12 and 21/22, respectively. The two storage cells 30 and 40 are provided with feedback through the OR gates 50 and 60.

The gated feedback latch architecture of FIG. 3 provides anti-SEE protection for the HBTs of the pass cells 10 and 20 in case of completely independent data inputs. However, the gated feedback latch architecture of FIG. 3 has several drawbacks. For example, a SEE in any of the storage cell HBTs results in unrecoverable distortion of the corresponding data output voltages 91/92 due to the base current pulse described above. Also, a SEE in any of the HBTs of the OR-gates 50 and 60 results in an erroneous change of state in the storage cells 30 and 40 when operating in the storage mode. Further, a SEE in any of the tail current sources 70 and 80 results in significant distortion of the output signals, as well as a disturbance of the reference voltage 90, which propagates to all cells connected to the same reference node. Additionally, the gated feedback latch architecture of FIG. 3 is actually an emitter-coupled logic (ECL) architecture that utilizes emitter followers for driving both top-level and bottom-level inputs. As a result, ECL gates require higher supply voltages and consume significantly higher power compared to similar CML gates.

SUMMARY OF THE INVENTION

The present invention provides a new approach to the anti-SEE protection of a complete library of basic CML cells without significant degradation of the speed-power performance of those cells.

In accordance with a first aspect of the present invention, method of providing anti-SEE protection of high speed data paths in a cell of a CML integrated circuit comprises the following: converting a SEE induced HBT collector current pulse of the cell to a low voltage level by use of a collector loading resistor; hard limiting collector and base voltages of an HBT of the cell to a level that is lower than a voltage in any undisturbed operational mode of the cell and that is still sufficiently high to prevent any unrecoverable changes of internal node voltages of the cell due to a SEE; providing a low-impedance path for a SEE-induced base current pulse of the cell; and, combining outputs of the cell by use of a logical function utilizing a pair of HBTs having at least base and emitter nodes such that any erroneous voltage at one of the base nodes does not disturb a voltage on the emitter nodes as long as a voltage on the emitter node is lower than the lowest operational level the other of the base nodes, wherein the logical function comprises one of an OR function and a NOR function.

In accordance with a second aspect of the present invention, an integrated circuit having protection of a low-speed path against a SEE comprises a strike sensitive node in the integrated circuit, a node to be protected in the integrated circuit such that the node to be protected is in the low-speed path, and a low-pass filter between the strike sensitive node and the node to be protected. The low-pass filter has a time constant that is a high time constant.

In accordance with a third aspect of the present invention, a voltage shifting unit implementing protection against a SEE, the voltage shifting unit comprises an input, an output, an HBT, a series resistor, and a Schottky diode. The HBT has an emitter node connected to the output and a base node connected to the input. The series resistor is connected between a positive supply rail and a collector node of the HBT, and the resistor is arranged to convert a SEE-induced current pulse into a negative voltage pulse. The Schottky diode has an anode connected to the base node of the HBT and a cathode connected to the collector node of the HBT, and the Schottky diode is arranged to provide a low-impedance path for a SEE-induced base current pulse.

In accordance with a fourth aspect of the present invention, a CML tail current source in the form of a current mirror having anti-SEE protection comprises an anti-SEE protected current-defining section, at least one anti-SEE protected current-reproducing section, and a capacitor. The anti-SEE protected current-defining section has an input driven by a current source and having an output connected to a common reference node. The at least one anti-SEE protected current-reproducing section has an input connected to the common reference node and an output that is arranged to supply a mirrored tail current to an associated CML cell. The capacitor forms a low-pass filter with at least one of the current-defining section and the current-reproducing section, the capacitor is coupled to the common reference node, and the low-pass filter has a time constant arranged to provide protection against a SEE.

In accordance with a fifth aspect of the present invention, an EF cell protected against a SEE comprises first and second inputs, an output, first, second, and third HBTs, first and second resistors, first and second Schottky diodes, a degeneration resistor, a voltage limiter, a limiting resistor, and a filtering resistor. The first HBT has a first emitter node connected to the output and a first base node connected to the first input. The first resistor is connected between a positive supply rail and a first collector node of the first HBT, and the first resistor is arranged to convert a SEE-induced current pulse into a negative voltage pulse. The first Schottky diode has a first anode connected to the first base node and a cathode connected to the first collector node, and the first Schottky diode is arranged to provide a low-impedance path for a SEE-induced base current pulse. The second HBT has a second emitter node connected to the output and a second base node connected to the second input. The second resistor is connected between the positive supply rail and a second collector node of the second HBT, and the second resistor is arranged to convert a SEE-induced current pulse into a negative voltage pulse. The second Schottky diode has a second anode connected to the second base node and a cathode connected to the second collector node, and the second Schottky diode is arranged to provide a low-impedance path for a SEE-induced base current pulse. The third HBT has a third collector node, a third base node, and a third emitter node. The degeneration resistor couples the third emitter node to a negative supply rail. The voltage limiter is connected to the third collector node in order to provide a low-impedance path for a SEE-induced current pulse, and the voltage limiter has an output impedance. The limiting resistor has a value that is much higher than the output impedance of the voltage limiter, and the limiting resistor couples the third collector node to first and second emitters. The filtering resistor couples the base node to a capacitor, and the filtering resistor forms the low-pass filter with the capacitor.

In accordance with a sixth aspect of the present invention, a dual-redundant CML buffer stage having protection against a SEE comprises first and second differential CML inputs arranged to receive logically equivalent but electrically isolated input signals, first and second differential CML outputs arranged to receive logically equivalent but electrically isolated output signals, and an internal processing circuit coupled between the first and second differential CML inputs and the first and second differential CML outputs. The internal processing circuit is arranged to provide protection against a SEE so as to ensure that the output signals are unaffected by particles striking the dual-redundant CML buffer stage.

In accordance with a seventh aspect of the present invention, a dual CML current switch cell having protection against a SEE comprises first and second differential cell inputs, a differential cell output, first and second differential current switches, an anti-SEE protected current-defining section, at least one anti-SEE protected current-reproducing section, a capacitor, first and second resistors, and first voltage and second voltage limiters. The first differential current switch has a first differential switch input, a first switch output, and a first switch source node, wherein the first differential switch input is coupled to the first differential cell input. The second differential current switch has a second differential switch input, a second switch output, and a second switch source node. The second first differential switch input is coupled to the second differential cell input, and the first and second switch outputs are coupled to the differential cell output. The anti-SEE protected current-defining section has an input driven by a current source and has an output connected to a common reference node. The at least one anti-SEE protected current-reproducing section has an input connected to the common reference node and an output coupled to the first and second switch source nodes. The capacitor forms a low-pass filter with at least one of the current-defining section and the current-reproducing section, the capacitor is coupled to the common reference node, and the low-pass filter has a time constant arranged to provide protection against a SEE. The first resistor couples the first switch output to a positive supply rail, and the first resistor is arranged to convert a SEE-induced current pulse into a negative voltage pulse. The second resistor couples the second switch output to the positive supply rail, and the second resistor is arranged to convert a SEE-induced current pulse into a negative voltage pulse. The first voltage limiter is connected to the first switch output. The second voltage limiter is connected to the second switch output.

In accordance with an eighth aspect of the present invention, a CML logic AND cell comprises first and second top-level differential inputs, a differential output, a standard CML AND gate, first and second voltage limiters, first and second resistors, and a differential current switch. The standard CML AND gate has first and second standard CML AND gate inputs connected to the first top-level differential input and first and second standard CML AND gate outputs connected to the differential output of the cell. The first voltage limiter is coupled to the first standard CML AND gate output. The second voltage limiter is coupled to the second standard CML AND gate output. The first resistor couples the first standard CML AND gate output to a positive supply rail, and the first resistor is arranged to convert a SEE-induced current pulse into a negative voltage pulse. The second resistor couples the second standard CML AND gate output to the positive supply rail, and the second resistor is arranged to convert a SEE-induced current pulse into a negative voltage pulse. The differential current switch has first and second inputs connected to the second top-level differential input, first and second output nodes connected to the first and second standard CML AND gate outputs, and source nodes coupled to source nodes of the standard CML AND gate.

In accordance with a ninth aspect of the present invention, a CML multiplexer cell comprises first, second, and third top-level differential cell inputs, a bottom-level differential cell input, a differential cell output, first, second, third, fourth, fifth, sixth, seventh, and eighth HBTs, first and second resistors, first and second voltage limiters, a tail current source, and first, second, third, and fourth Schottky diodes. The first and second HBTs have respective first and second emitter nodes, first and second collector nodes, and first and second base nodes. The first and second base nodes are coupled to the first top-level differential cell input. The first resistor couples the first collector node to a positive supply rail, and the first resistor is arranged to convert a SEE-induced current pulse into a negative voltage pulse. The second resistor couples the second collector node to the positive supply rail, and the first resistor is arranged to convert a SEE-induced current pulse into a negative voltage pulse. The first voltage limiter is coupled to the first collector node, and the second voltage limiter is coupled to the second collector node. The third and fourth HBTs have respective third and fourth emitter nodes, third and fourth collector nodes, and third and fourth base nodes. The third and fourth base nodes are coupled to the second top-level differential cell input, the third collector node is coupled to the first collector node, and the fourth collector node is coupled to the second collector node. The fifth and sixth HBTs have respective fifth and sixth emitter nodes, fifth and sixth collector nodes, and fifth and sixth base nodes. The fifth and sixth base nodes are coupled to the third top-level differential cell input, the fifth collector node is coupled to the first collector node, and the sixth collector node is coupled to the second collector node. The seventh and eighth HBTs have respective seventh and eighth emitter nodes, seventh and eighth collector nodes, and seventh and eighth base nodes. The seventh and eighth base nodes are coupled to the bottom-level differential cell input. The tail current source has an output connected to the seventh and eighth emitters. The first Schottky diode has a first cathode connected to seventh collector node and a first anode connected to the first and second emitter nodes. The second Schottky diode has a second cathode connected to the eighth collector node and a second anode connected to the third and fourth emitter nodes. The third Schottky diode has a third cathode connected to seventh collector node and a third anode connected to the fifth and sixth emitter nodes. The fourth Schottky diode has a fourth cathode connected to the eighth collector node and a fourth anode connected to the fifth and sixth emitter nodes.

In accordance with a tenth aspect of the present invention, a dual-redundant CML logic stage with full protection from SEEs comprises first and second differential stage inputs, first and second differential stage outputs, and first, second, third, and fourth dual current-switching cells. Each of the first, second, third, and fourth dual current-switching cells has first and second cell inputs and a cell output. The first, second, third, and fourth dual current-switching cells are connected in a circle so that the second cell input of the first dual current-switching cell is coupled to the first differential stage input, the first cell input of the second dual current-switching cell is coupled to the cell output of the first dual current-switching cell, the second cell input of the second cell is coupled to the first differential stage input, the cell output of the second dual current-switching cell is coupled to the first differential stage output, the first cell input of the third dual current-switching cell is coupled to the cell output of the second dual current-switching cell, and the second cell input of the third dual current-switching cell is coupled to the second differential stage input, the first cell input of the fourth dual current-switching cell is coupled to the cell output of the third dual current-switching cell, the second cell input of the fourth dual current-switching cell is coupled to the second differential stage input, the cell output of the fourth dual current-switching cell is coupled to the second differential stage output, and the first cell input of the first dual current-switching cell is coupled to the cell output of the fourth dual current-switching cell. Each of the first, second, third, and fourth dual current-switching cells is SEE protected.

BRIEF DESCRIPTION OF THE DRAWINGS

The accompanying drawings, which illustrate embodiments of the present invention, include:

FIG. 1 illustrates a model of an HBT under a particle strike as a subcircuit including the basic HBT model and three current pulse sources;

FIG. 2 illustrates the simulated shapes of the current pulses induced by the strike;

FIG. 3 illustrates a schematic of a latch that is SEE-hardened in accordance with a previous technique;

FIG. 4 illustrates a schematic of an ASP dual emitter follower in accordance with one aspect of the present invention;

FIG. 5 illustrates a block diagram of a ASP CML buffer with bottom-level inputs and outputs in accordance with another aspect of the present invention;

FIG. 6 illustrates a block diagram of a ASP CML buffer with top-level inputs and outputs in accordance with still another aspect of the present invention;

FIG. 7 illustrates a schematic of a standard CML buffer for the purpose of illustration;

FIG. 8 illustrates a schematic of a SEE Disturbance Rejection (SDR) dual current switch in accordance with yet another aspect of the present invention;

FIG. 9 illustrates a block diagram of an ASP CML logic stage in accordance with a further aspect of the present invention;

FIG. 10 illustrates a schematic of an ASP n-p-n current mirror in accordance with still a further aspect of the present invention;

FIG. 11 illustrates a schematic of a SDR AND cell in accordance with yet a further aspect of the present invention; and, FIG. 12 illustrates a schematic of a SDR 2-to-1 multiplexer cell in accordance with an additional aspect of the present invention.

DETAILED DESCRIPTION

ASP Techniques for Bottom-Level CML Signals

Anti-SEE protection utilizing logic functions requires a number of sophisticated techniques. Based on the model of a SEE in an HBT presented in FIG. 1, a possible anti-SEE protection approach is the implementation of the logic OR function in the form of common-emitter structures 50/60 shown in FIG. 3. However, the main problem with the OR function implementation based on HBTs is the SEE-initiated negative base current pulse $i_{Bp}$ that increases the base node voltage in all practical cases of the base node termination. This pulse results in an associated increase of the transistor's emitter current and the emitter node voltage, which cannot be rejected by the OR function. Consequently, the gated feedback latch of FIG. 3 does not provide any protection against the SEE in the HBTs of the storage cells 30/40 and in the OR-gates 50/60.

In accordance with an embodiment of the present invention, this problem is solved by an improved common-emitter structure of an anti-SEE protection emitter follower (ASP EF) cell 100 that is shown in FIG. 4. The circuit of the ASP EF cell 100 includes two equivalent voltage-shifting sections 110a and 110b with separate inputs 111a and 111b and with coupled outputs 112a and 112b connected to a common current sink 120 having a tail current $I_0$. The ASP EF cell 100 operates with two logically equal but electrically isolated signals applied to the inputs 111a and 111b of the voltage-shifting sections 110a and 110b.

The current sink 120 may be provided in accordance with the current-reconstructing section 820 described below.

The sections 110a and 110b includes respective HBTs 113a and 113b whose emitter nodes are connected to the corresponding outputs 112a and 112b, thus creating a common-emitter node between the two sections 110a and 110b. Schottky diodes 115a and 115b are connected in parallel with the respective base-collector junctions of corresponding HBTs 113a and 113b. The collector nodes of the HBTs 113a and 113b are connected to a positive supply rail 1 through corresponding resistors 114a and 114b. The resistances R of the resistors 114a and 114b are selected in accordance with two restrictions. First, the normal voltage drop $RI_0$ across the resistors 114a and 114b must be low enough to keep the transistors 113a and 113b in their active operational region. Second, the SEE-induced voltage drop $R(I_0+i_{Cn})$ across the resistors 114a and 114b must be high enough to open the Schottky diodes 115a and 115b in order to establish a low-impedance path for the SEE-generated base currents and to prevent any rise of the base node voltages.

In this case, the SEE-affected voltage-shifting section 110a or 110b is turned off so that current through the corresponding HBT is cut off while the output voltage at the common-emitter node is supported by the other voltage-shifting section 110a or 110b.

A negligible variation of the output voltage is caused by the change of the current running through the active one of the HBTs 113a and 113b.

A similar performance could be achieved without the diodes 115a and 115b by utilization of an open base-to-collector junction of the transistors 113a and 113b. Unfortunately, this open base-to-collector junction configuration leads to switching of the transistors 113a and 113b into the reverse operational mode, which results in reversed emitter current and erroneous low common-emitter node voltage. The Schottky diodes 115a and 115b, which open at a significantly lower direct voltage, provide an alternative path for the base currents while keeping the appropriate one of the transistors 113a and 113b switched off.

The unconditional protection of the common-emitter node in the described structure of FIG. 4 facilitates two versions of ASP buffers 600 and 700 as shown in FIG. 5 and FIG. 6.

As shown in FIG. 5, the first buffer stage 600 operates with bottom-level CML input/output signals provided by external ASP EF cells and includes two standard CML buffer cells 201 and 202 each being constructed in accordance a buffer cell 200 shown in FIG. 7. The CML buffer cells 201 and 202 accept corresponding input bottom-level differential signals 611/612 and 621/622 and convert these signals into corresponding top-level CML signals 613/614 and 623/624. The direct parts of these signals are applied to the inputs of two ASP EF cells 101 and 103, and the inverted parts of these signals are applied to the inputs of two ASP EF cells 102 and 104.

Each of the ASP EF cells 101, 102, 103, and 104 performs the logic OR function. The ASP EF cells 101 and 102 deliver the first pair of direct and inverted signals 615 and 616 to the first bottom-level differential output of the stage 600. The ASP EF cells 103 and 104 likewise deliver the second pair of direct and inverted signals 625 and 626 to the second bottom-level differential output of the stage 600.) As a result, the first and second differential output signals of the stage 600 are logically equivalent but are electrically isolated.

An instance of the ASP EF cell 100 of FIG. 4 is used for each of the ASP EF cells 101, 102, 103, and 104.

A SEE in any of the switching HBTs 203 and 204 (FIG. 7) of the CML buffer cells 201/202 results in corruption of both input and output signals of the buffers. To avoid big unrecoverable deviations of the voltages on nodes 613, 614, 615, and 616 caused by SEE -induced collector currents, minimum levels of these voltages are limited by limiters 300a, 300b, 300c, and 300d, each including an HBT diode with its emitter node connected to the output of the corresponding limiter and its joint base and collector nodes connected to a global temperature-stabilized and process-compensated reference voltage 5. The limiters 300b, 300c, and 300d may each be constructed as a transistor coupled so as to form a diode as shown by the limited 300a in FIG. 5.

This reference voltage can be generated using well-known techniques.

In accordance with the performance of the ASP EF cell described above, it can be seen that both output signals of the stage always stay correct, following the input signal, in spite of SEE-related corruptions of internal signals.

The second buffer stage 700 created in accordance with an embodiment of the present invention has the same internal blocks 101, 102, 103, 104, 201, and 202. But these blocks are placed in a reversed order, with top-level input signals 711, 712, 721, and 722 initially processed by the ASP EF cells 101, 102, 103, and 104 and then shifted up to top-level outputs 715, 716, 725, and 726 by the CML buffer cells 201 and 202. It must be noted that, unlike in the first buffer stage 600, one of the outputs of the second buffer stage 700 is corrupted in the event of a SEE while the other output stays correct.

ASP Techniques for Top-Level CML Signals

Though the ASP EF cells developed in accordance with embodiments of the present invention can provide a complete anti-SEE protection of bottom-level CML signals, the same protection of top-level signals requires different techniques. The logic NOR function performed by a dual current switch 400 as shown in FIG. 8 is capable of rejecting the low erroneous voltages at any one pair of its input differential nodes 411/412 or 413/414, but provides no protection against a SEE in HBTs 415, 416, 417, or 418 of the switch itself. The differential nodes 411/412 and 413/414, for example, may be top-level input nodes.

In this last case, a SEE-induced collector current in the affected transistor (e.g., the HBT 415 or the HBT 416) increases the voltage drop across a corresponding loading resistor 419 or 420, which leads to disturbances of the output voltage at a corresponding collector node 421 or 422 and both input base node voltages 411 and 413 or 412 and 414 associated with the HBTs connected to the corrupted collector node 415/417 or 416/418. Limiting the collector voltages by use of low-impedance voltage limiters 301a and 301b can reduce the value of the disturbances, but this voltage limiting of the collector voltages is not enough for the complete protection of the cell.

A current source 423 is coupled to the emitter nodes of HBTs 415, 416, 417, and 418 as shown in FIG. 8 and may be provided in accordance with the current-reconstructing section 820 described below.

In accordance with embodiments of the present invention, this difficulty is rectified by the dual-input/output redundant architecture of an ASP CML logic stage 500 illustrated in FIG. 9. The logic stage 500 includes four equivalent dual CML current switches 401, 402, 403, and 404 with two or more top-level differential inputs, one or more bottom-level differential inputs, and one top-level-level differential output. An instance of the dual current switch 400 may be use for each of the dual CML current switches 401, 402, 403, and 404. Each of the dual CML current switches 401, 402, 403, and 404 shown in FIG. 9 has three top-level differential inputs and one bottom-level input. However, for the purpose of generalization, cells with two or more top-level inputs and one or more bottom-level input may be used in FIG. 9. Thus, in the case where the dual current switch 400 is used for each of the dual CML current switches 401, 402, 403, and 404, the dual CML current switches 401, 402, 403, and 404 would have only two top-level differential inputs and one bottom-level input.

The current switches 401, 402, 403, and 404 are connected in a circle in such a way that the differential output of a previous cell is connected to the first top-level differential input of the next cell. The second top-level differential inputs of cells 401 and 402 are both connected to top-level differential input 511/512 of the logic stage 500, while the second top-level differential inputs of cells 403 and 404 are both connected to top-level differential input 521/522 of the logic stage 500. The third top-level differential inputs of cells 401 and 402 are both connected to top-level differential input 513/514 of logic stage 500, while the second top-level differential inputs of cells 403 and 404 are both connected to top-level differential input 523/524 of logic stage 500. The bottom-level differential inputs of cells 401 and 402 are both connected to bottom-level differential input 515/516 of logic stage 5001 while the bottom-level differential inputs of cells 403 and 404 are both connected to bottom-level differential input 525/526 of logic stage 500. The output of cells 402 and 404 are correspondingly connected to top-level differential outputs 517/518 and 527/528 of the logic stage 500.

As can be seen from FIG. 9, a SEE in any individual cell (e.g., the current switch 402) corrupts three signals associated with the inputs/outputs of this cell, which may include one input and one output of the logic stage 500 (in this case, 511/512 or 513/514 and 517/518). However, the other input and output of the logic stage 500 (in this case, 521/522, 523/524, and 527/528) are undisturbed.

A limiting unit is coupled to the output nodes of the dual CML current switch 401, a limiting unit is coupled to the output nodes of the dual CML current switch 402, a limiting unit is coupled to the output nodes of the dual CML current switch 403, and a limiting unit is coupled to the output nodes of the dual CML current switch 404. These limiting units are not shown in FIG. 9 but are derived from the dual current switch 400 shown in FIG. 8.

ASP Techniques for Tail Current Sources and Current Mirrors

The tail current sources of CML cells are created as current-reproducing sections of a multi-output n-p-n current mirror. In accordance with the present invention, an ASP n-p-n current mirror 800 is shown in FIG. 10 and includes a current-defining section 810 that is driven by a certain current source 830 and supplies a certain reference voltage to one or more current-reconstructing (mirror) sections 820 through a local reference line 3. The local reference line 3 is always decoupled from a negative supply rail 2 by a large capacitor 4.

In accordance with embodiments of the present invention, each section 820 includes a HBT 821 whose emitter node is connected to the negative supply rail 2 through a degeneration resistor 822 and whose base node is connected to the local reference line 3 through a filtering resistor 823. A collector node of the HBT 821 is directly connected to a low-impedance output of a voltage limiter 302 and is connected to a current-sinking output 824 through a limiting resistor 825.

A SEE-induced current pulse through the collector node of the HBT 821 flows partly through the resistor 825, thus causing a drop of the collector node voltage that opens the voltage limiter 302. As a result, the main part of the SEE-induced current flows through the voltage limiter 302 and thus causes minimum disturbance of the cell's tail current. The efficiency of this protection depends on the ratio between the values of the resistance of the resistor 825 and the output resistance of the voltage limiter 302, and is restricted by the tolerable voltage drop across the resistor 825 in the normal operational mode. Accordingly, the resistance of the resistor 825 should have a value that is much higher than the value of the output resistance of the voltage limiter 302. The SEE-induced base current pulses are suppressed in the same way by means of the resistor 823 and the base-collector junction of the HBT 821. A low-pass filter comprising the resistor 823 and the capacitor 4 effectively filters out the resulting base node voltage pulses, thus keeping the local reference line 3 undisturbed.

In accordance with embodiments of the present invention, the current-defining section 810 includes a HBT 811 whose emitter node is connected to the negative supply rail 2 through a degeneration resistor 812 and whose base node is connected to the local reference line 3 through a filtering resistor 813. The current into the local reference line 3 is provided through the output 112 of the voltage-shifting unit 110 shown in FIG. 4. The input 111 of the voltage-shifting unit 110 is connected to the collector node of the HBT 811, thus creating a diode-like structure. The parameters of these components are related to those of similar components in the section 820 in accordance with the well-known theory of the current mirror operation.

SEE-related disturbances of the voltage on the local reference line 3 can be associated with either the HBT 811, or with the voltage-shifting unit 110. SEE-induced current pulses in the HBT 811 manifest themselves as negative voltage pulses at the collector node of the transistor. The resulting low collector voltage closes the HBT of the voltage-shifting unit 110 and is then filtered out by a low-pass filter comprising the reverse-biased base-emitter junction of the transistor 113*a* or 113*b* and the decoupling capacitor 4. Base current pulses are suppressed in the same way as in the voltage-shifting unit 810.

EXAMPLES of 2-LEVEL SDR CML CELLS

The schematics of two main 2-level CML cells 210 and 230, utilizing the ASP techniques described herein, are shown respectively in FIG. 11 and FIG. 12. To achieve anti-SEE protection, the cells 210 and 230 should be incorporated into the architecture shown in FIG. 9.

The first cell 210 shown in FIG. 11 performs the logic AND function and comprises a standard CML AND gate with two switching HBTs 223 and 224, a top-level differential input 211/212 coupled to the bases of the two switching HBTs 223 and 224, a bottom-level differential input 213/214 coupled to the bases of two HBTs 226 and 227, an ASP tail current source 215, and the voltage limiters 303*a* and 303*b* coupled to the collectors of the two switching HBTs 223 and 224 and to outputs 217/218 of the first cell 210. The emitters of the HBTs 226 and 227 are connected to the ASP tail current source 215, the bases of the HBTs 226 and 227 are connected to bottom-level differential input 213/214, and the collector of the HBT 226 is connected to the emitters of the HBTs 223 and 224 and to the emitters of two additional HBTs 219 and 220. The two additional HBTs 219 and 220 are connected to an additional top-level differential input 221/222. The emitter of an HBT 228 is connected to the collector the HBT 227, the collector of the HBT 228 is connected to the output 217, and the base of the HBT 228 is connected to the positive voltage rail 1. The HBTs 219 and 220 create a dual current switch with the top-level switching transistors 223 and 224 in order to implement the SDR technique in accordance with an aspect of the present invention.

The current-reconstructing section 820 of the current mirror 800 discussed below may be used for the ASP tail current source 215.

The second cell 230 shown in FIG. 12 represents a 2-to-1 CML multiplexer and includes a standard CML multiplexer gate with top-level differential inputs 231/232 and 233/234, bottom-level differential input 235/236, an ASP tail current source 237, and voltage limiters 304*a* and 304*b* for outputs 239/240 of the cell 230.

The current-reconstructing section 820 of the current mirror 800 discussed below may be used for the ASP tail current source 237.

The implementation of the SDR technique in the cell 230 would require two additional pairs of HBTs to create dual current switches with the top-level differential pairs of HBTs 241/242 and 243/244. To minimize the additional capacitance introduced by additional transistors to the input and output nodes of the cell 230, the cell 230 incorporates a single additional pair of HBTs 245/246 connected to an additional top-level differential input 247/248. The HBTs 245/246 can create a dual current switch both with the HBTs 241/242 and with the HBTs 243/244, depending on the states of the bottom-level switching transistors 245/246.

The selection is performed by means of logic OR functions implemented as two pairs of Schottky diodes 249/250 and 251/252, which are inserted between the bottom and top levels of the cell 230 as shown in FIG. 12.

The bases of HBTs 253 and 254 are connected respectively to bottom-level differential inputs 235 and 236. The emitters of the HBTs 253 and 254 are connected to the ASP tail current source 237, the collector of the HBT 253 is connected to the cathodes of the Schottky diodes 249 and 250, and the collector of the HBT 254 is connected to the cathodes of the Schottky diodes 251 and 252. The anode of the Schottky diode 249 is connected to the emitters of the HBTs 241 and 242, the anode of the Schottky diode 252 is connected to the emitters of the HBTs 243 and 244, and the anodes of the Schottky diodes 250 and 251 are both connected together and to both of the emitters of the HBTs 245 and 246.

The ASP n-p-n current mirror 800 may be used for the ASP tail current source 237. In this case, the output 824 of the ASP n-p-n current mirror 800 is connected to the common emitter nodes of the bottom-level HBTs 247 and 248.

The collector nodes of the HBTs 241, 243, and 245 are connected to the output node 240 of the cell 230, to the output node of the voltage limiter 304*a*, and to the positive rail 1 through a loading resistor 255. The collector nodes of the HBTs 242, 244, and 246 are connected to the output node 239 of the cell 230, to the output node of the voltage limiter 304*b*, and to the positive rail 1 through a loading resistor 256.

In accordance with the well-known specifics of the CML architecture, the cell 230 can be converted into other main CML cells, such as a latch cell and an XOR cell, by cross-connection of the input 233/234 either to the output 239/240, or to the input 231/232. As can be understood, this does not affect the anti-SEE protection achieved in accordance with the present invention.

There are many aspects of the present invention as described above. Modifications of the present invention will occur to those practicing in the art of the present invention. Accordingly, the description of the present invention is to be construed as illustrative only and is for the purpose of teaching those skilled in the art the best mode of carrying out the invention. The details may be varied substantially without departing from the spirit of the invention, and the exclusive use of all modifications which are within the scope of the appended claims is reserved.

What is claimed is:

1. A method of providing anti-SEE protection of high speed data processing paths in a cell of a CML integrated circuit comprising: converting a SEE induced collector current pulse in a HBT of the cell to a low voltage level by use of a collector loading resistor connected to a collector node of the HBT; hard limiting a voltage of the collector node of the HBT to a level that is lower than a lowest logic voltage in the collector node during undisturbed operation of the cell and that is still sufficiently high to prevent an unrecoverable disturbance of other nodes of the cell due to a SEE; providing a low-impedance path for a SEE-induced current pulse in a base node of the HBT of the cell in order to limit a voltage of the base node to a level that is lower than a lowest logic voltage in the base node during the undisturbed operation of the cell and that is still sufficiently high to prevent an unrecoverable disturbance of the other nodes of the cell; wherein the HBT modified by application of the above techniques for converting the collector current pulse, hard limiting the collector voltage, and providing a low-impedance path represents a modified switching component; wherein the base, collector, and emitter nodes of the HBT represent the respective base, collector and emitter nodes of the switching component, while a loading resistor node not connected to the HBT's collector node represents a resistor node of the switching component; adding one additional input for each main input of the cell so that the corresponding main and additional inputs receive two independent but logically and electrically equivalent signals; combining the corresponding main and additional inputs of the cell by use of a logic function utilizing two switching components, wherein the first switching component has its base node connected to the main input of the cell and the second switching component has its base node connected to the additional input of the cell, and wherein the logic function comprises one of an OR function and a NOR function.

2. The method of claim 1 wherein the low-impedance path for a SEE-induced current pulse in a base node of the HBT is implemented as a Schottky diode having an anode connected to the base node of the HBT and a cathode connected to the collector node of the HBT.

3. The method of claim 2 wherein the logic function comprises the OR function, wherein the first and second switching components have common emitter nodes and separate base and collector nodes such that any erroneous voltage at one of the base nodes does not significantly disturb a voltage at the common emitter nodes as long as a voltage at the other of the base nodes is kept at a correct operational level, and wherein the common emitter nodes represent an output of the cell.

4. An EF cell implementing the method of claim 3 wherein the HBT comprises a first HBT, and wherein the cell's output is connected to a current reproducing section comprising: a second HBT having a collector node, a base node, and an emitter node; a voltage limiter connected to the collector node of the second HBT in order to provide a low-impedance path for a SEE-induced collector current pulse, wherein the voltage limiter has an output impedance; a limiting resistor having a value that is much higher than the output impedance of the voltage limiter, wherein the limiting resistor couples the collector node of the second HBT to an output of the section; and, a filtering resistor coupling the base node of the second HBT to the input of the section and to a capacitor, wherein the filtering resistor forms a low-pass filter with the capacitor.

5. An EF cell implementing the method of claim 3 wherein the cell's output is connected to a loading resistor.

6. A dual-redundant CML buffer stage implementing the method of claim 3 and comprising:
first and second differential CML inputs arranged to receive logically equivalent but electrically isolated input signals;
first and second differential CML outputs arranged to provide logically equivalent but electrically isolated output signals; and,
an internal processing circuit coupled between the first and second differential CML inputs and the first and second differential CML outputs, wherein the internal processing circuit is arranged to ensure that at least one of the output differential signals is unaffected by results of a SEE in the dual-redundant CML buffer stage.

7. The dual-redundant CML buffer stage of claim 6 wherein the inputs are configured to receive bottom-level CML signals.

8. The dual-redundant CML buffer stage of claim 7, wherein the first and second differential CML outputs comprise the first and second direct and inverted single-ended outputs respectively, and wherein the internal processing circuit comprises: a first standard CML buffer cell having a direct output, an inverted output, and a differential input, wherein the differential input of the first standard CML buffer cell is connected to the first differential input of the stage; a second standard CML buffer cell having a direct output, an inverted output, and a differential input, wherein the differential input of the second standard CML buffer cell is connected to the second differential input of the stage; four equivalent voltage limiters connected respectively to the first and second direct and inverted outputs; and, first, second, third, and fourth EF cells, wherein the four EF cells couple the outputs of the first and second standard CML buffer cells to the differential outputs of the stage in such a way that the first direct output of the stage is connected to output of the first EF cell, the second direct output of the stage is connected to the output of the third EF cell, the first inverted output of the stage is connected to the output of the second EF cell, and the second inverted output of the stage is connected to the output of the fourth EF cell, the direct output of the first standard CML buffer cell is connected to first inputs of the first and third EF cells, the inverted output of the first standard CML buffer cell is connected to the first inputs of the second and fourth EF cells, the direct output of the second standard CML buffer cell is connected to second inputs of the first and third EF cells, and the inverted output of the second standard CML buffer cell is connected to the second inputs of the second and fourth EF cells; wherein the HBT comprises a first HBT, and wherein each of the first, second, third, and fourth EF cells comprises: a second HBT having a collector node, a base node, and an emitter node; a voltage limiter connected to the collector node of the second HBT in order to provide a low-impedance path for a SEE-induced collector current pulse, wherein the voltage limiter has an output impedance; a limiting resistor having a value that is much higher than the output impedance of the voltage limiter, wherein the limiting resistor couples the collector node of the second HBT to an output of the section; and, a filtering resistor coupling the base node of the second HBT to the input of the section and to a capacitor, wherein the filtering resistor forms a low-pass filter with the capacitor.

9. The dual-redundant CML buffer stage of claim 6 wherein the inputs are configured to receive top-level CML signals.

10. The dual-redundant CML buffer stage of claim 9 wherein the first and second differential CML inputs comprise the first and second direct and inverted inputs respectively, and wherein the internal processing circuit comprises: a first standard CML buffer cell having a direct input, an inverted input, a direct output, and an inverted output, wherein the direct output and the inverted output of the first standard CML buffer cell provide the first differential output of the stage; a second standard CML buffer cell having a direct input, an inverted input, a direct output, and an inverted output, wherein the direct output and the inverted output of the second standard CML buffer cell provide the second differential output of the stage; four equivalent voltage limiters connected respectively to the direct and inverted outputs of the first and second buffer cells; and, first, second, third, and fourth EF cells having corresponding first, second, third, and fourth EF outputs, wherein the first EF output is coupled to the direct input of the first standard CML buffer cell, wherein the second EF output is coupled to the inverted input of the first standard CML buffer cell, wherein the third EF output is coupled to the direct input of the second standard CML buffer cell, wherein the fourth EF output is coupled to the inverted input of the second standard CML buffer cell, wherein the first input of the stage is connected to first inputs of the first and third EFs, wherein the second input of the stage is connected to first inputs of the second and fourth EFs, wherein the third input of the stage is connected to second inputs of the first and third EFs, and wherein the fourth input is connected to second inputs of the second and fourth EFs; wherein the HBT comprises a first HBT, and wherein each of the first, second, third, and fourth EF cells comprises: a second HBT having a collector node, a base node, and an emitter node; a voltage limiter connected to the collector node of the second HBT in order to provide a low-impedance path for a SEE-induced collector current pulse, wherein the voltage limiter has an output impedance; a limiting resistor having a value that is much higher than the output impedance of the voltage limiter, wherein the limiting resistor couples the collector node of the second HBT to an output of the section; and, a filtering resistor coupling the base node of the second HBT to the input of the section and to a capacitor, wherein the filtering resistor forms a low-pass filter with the capacitor.

11. The method of claim 1 wherein the low-impedance path for a SEE-induced current is implemented as a base-to-collector p-n junction of the HBT.

12. The method of claim 11 wherein the logic function comprises the NOR function, wherein the first and second switching components have common emitter nodes, separate base nodes, and common collector nodes such that any erroneous voltage at one of the base nodes does not significantly disturb a voltage at the common collector nodes as long as a voltage at the other of the base nodes is kept at a correct operational level, wherein the collector loading resistors are connected in parallel, and wherein the common collector nodes represent an output of the cell.

13. A dual CML buffer cell implementing the method of claim 12 and comprising: a first and a second differential cell inputs, each comprising a direct and inverted single-ended inputs; a differential cell output comprising a direct and inverted single-ended outputs; a differential current switch with anti-SEE protection that consists of two switching components and has a direct main input, an inverted main input, a direct additional input, an inverted additional input, a direct output, an inverted output, and a source node, wherein the inputs of the first switching component are connected to the main and additional direct inputs of the current switch while its output is connected to the inverted output of the current switch, wherein the inputs of the second switching component are connected to the main and additional inverted inputs of the current switch while its output is connected to the direct output of the current switch, wherein the emitter nodes of both switching components are connected to the source node of the current switch, wherein the resistor nodes of the switching components are connected to a positive supply rail, wherein the main and additional inputs of the current switch are respectively connected to the first and second inputs of the cell, and wherein the outputs of the current switch are respectively connected to the outputs of the cell; at least one anti-SEE protected current reproducing section of the tail current source having an input connected to a common reference node and an output coupled to the source node of the current switch, the currently reproducing section comprising: a second HBT having a collector node, a base node, and an emitter node; a voltage limiter connected to the collector node of the second HBT in order to provide a low-impedance path for a SEE-induced collector current pulse, wherein the voltage limiter has an output impedance; a limiting resistor having a value that is much higher than the output impedance of the voltage limiter, wherein the limiting resistor couples the collector node of the second HBT to an output of the section; and, a filtering resistor coupling the base node of the second HBT to the input of the section and to a capacitor, wherein the filtering resistor forms a low-pass filter with the capacitor.

14. A dual CML logic AND cell implementing the method of claim 12 and comprising: first and second top-level differential inputs; a bottom-level differential input comprising a direct and inverted bottom-level single-ended inputs; a differential output; a differential current switch with anti-SEE protection, wherein the main and additional inputs of the current switch are respectively connected to the first and second top-level differential inputs of the cell and its differential output connected to the differential output of the cell; a standard CML current switch comprising two HBTs with their emitter nodes combined into a source node, wherein a base node of a first of the two HBTs is connected to the direct bottom-level input of the cell and a base node of a second of the two HBTs is connected to the inverted bottom-level input of the cell, and wherein a collector node of the first HBT is connected to the source node of the differential current switch with anti-SEE protection; at least one anti-SEE protected current reproducing section of the tail current source having an input connected to a common reference node and an output coupled to the source node of the standard current switch, the current reproducing section comprising: a further HBT having a collector node, a base node, and an emitter node; a voltage limiter connected to the collector node of the further HBT in order to provide a low-impedance path for a SEE-induced collector current pulse, wherein the voltage limiter has an output impedance; a limiting resistor having a value that is much higher than the output impedance of the voltage limiter, wherein the limiting resistor couples the collector node of the further HBT to an output of the section: and, a filtering resistor coupling the base node of the further HBT to the input of the section and to a capacitor, wherein the filtering resistor forms a low-pass filter with the capacitor.

15. The dual CML logic AND cell of claim 14 wherein a collector node of the second HBT is connected to the direct output of the cell.

16. A dual redundant CML AND stage with a full protection against SEE having first, second, third, and fourth dual CML AND cells each according to claim 15, the stage comprising: main and additional top-level differential inputs; main and additional bottom-level differential inputs; main and additional differential outputs; and wherein: the first top-level inputs of the first and second AND cells are connected together and to the main top-level input of the stage; the bottom-level inputs of the first and second AND cells are connected together and to the main bottom-level input of the stage; the first top-level inputs of the third and fourth AND cells are connected together and to the additional top-level input of the stage; the bottom-level inputs of the third and fourth AND cells are connected together and to the additional bottom-level input of the stage; the second top-level input of the first AND cell is connected to the output of the fourth AND cell that serves as the additional output of the stage; the second top-level input of the second AND cell is connected to the output of the first AND cell; the second top-level input of the third AND cell is connected to the output of the second AND cell that serves as the main output of the stage; the second top-level input of the fourth AND cell is connected to the output of the third AND cell.

17. The dual CML logic AND cell of claim 14 wherein a collector node of the second HBT is connected to an emitter node of a third HBT while a base node of the third HBT is connected to a positive supply rail and its collector node is connected to the direct output of the cell.

18. A dual-redundant CML AND stage with a full protection against SEE having first, second, third, and fourth dual CML AND cells each according to claim 17, the stage comprising: main and additional top-level differential inputs; main and additional bottom-level differential inputs; main and additional differential outputs; and wherein: the first top-level inputs of the first and second AND cells are connected together and to the main top-level input of the stage; the bottom-level inputs of the first and second AND cells are connected together and to the main bottom-level input of the stage; the first top-level inputs of the third and fourth AND cells are connected together and to the additional top-level input of the stage; the bottom-level inputs of the third and fourth AND cells are connected together and to the additional bottom-level input of the stage; the second top-level input of the first AND cell is connected to the output of the fourth AND cell that serves as the additional output of the stage; the second top-level input of the second AND cell is connected to the output of the first AND cell; the second top-level input of the third AND cell is connected to the output of the second AND cell that serves as the main output of the stage; the second top-level input of the fourth AND cell is connected to the output of the third AND cell.

19. A dual CML multiplexer cell implementing the method of claim 12 and comprising: first, second, and third top-level differential cell inputs each comprising a direct and inverted top level single-ended inputs; a bottom-level differential cell input comprising a direct and inverted bottom-level single-ended inputs; a differential cell output comprising a direct and inverted single-ended outputs; a first standard CML current switch comprising a first two HBTs with their emitter nodes combined into a first source node, wherein a base node of a first of the first two HBTs is connected to the first direct top-level input of the cell and a base node of a second of the first two HBTs is connected to the first inverted top-level input of the cell, and wherein a collector node of the first HBT is connected to the inverted output of the cell while a collector node of the second of the first two HBTs is connected to the direct output of the cell; a second standard CML current switch comprising a second two HBTs with their emitter nodes combined into a second source node, wherein a base node of a first of the second two HBTs is connected to the second direct top-level input of the cell and a base node of a second of the second two HBTs is connected to the second inverted top-level input of the cell, and wherein a collector node of the first of the second two HBTs is connected to the inverted output of the cell while a collector node of the second of the second two HBTs is connected to the direct output of the cell; a third standard CML current switch comprising a third two HBTs with their emitter nodes combined into a third source node, wherein a base node of a first of the third two HBTs is connected to the third direct top-level input of the cell and a base node of a second of the third two HBTs is connected to the third inverted top-level input of the cell, and wherein a collector node of the first of the third two HBTs is connected to the inverted output of the cell while a collector node of the second of the third two HBTs is connected to the direct output of the cell; a fourth standard CML current switch comprising a fourth two HBTs with their emitter nodes combined into a fourth source node, wherein a base node of a first of the fourth two HBTs is connected to the direct bottom-level input of the cell and a base node of a second of the fourth two HBTs is connected to the inverted bottom-level input of the cell, wherein a collector node of the first of the fourth two HBTs is connected to cathodes of a first and a second Schottky diodes and a collector node of the second of the fourth two HBTs is connected to cathodes of a third and a fourth Schottky diodes, while an anode of the first Schottky diode is connected to the first source node, an anode of the fourth Schottky diode is connected to the second source node, and anodes of the second and third Schottky diodes are connected to the third source node; at least one anti-SEE protected current reproducing section of a tail current source having an input connected to a common reference node and an output coupled to the source node of the fourth current switch, the current reproducing section comprising: a further HBT having a collector node, a base node, and an emitter node; a voltage limiter connected to the collector node of the further HBT in order to provide a low-impedance path for a SEE-induced collector current pulse, wherein the voltage limiter has an output impedance; a limiting resistor having a value that is much higher than the output impedance of the voltage limiter, wherein the limiting resistor couples the collector node of the further HBT to an output of the section; and, a filtering resistor coupling the base node of the further HBT to the input of the section and to a capacitor, wherein the filtering resistor forms a low-pass filter with the capacitor; a first resistor coupling the direct output of the cell to a positive supply rail and converting a SEE induced collector current pulse to a low voltage level; a second resistor coupling the inverted output of the cell to the positive supply rail and converting a SEE induced collector current pulse to a low voltage level; a first voltage limiter coupled to the direct output of the cell; a second voltage limiter coupled to the inverted output of the cell.

20. A dual CML latch cell comprising the multiplexer cell of claim 19 wherein its second differential top-level input is inversely coupled to the differential output of the cell that represents an output of the latch, wherein its first top-level differential input represents a data inputs of the latch, wherein its third top-level differential input represents an additional input of the latch, and wherein its bottom-level input represents a clock input of the latch.

21. A dual redundant CML latch stage with a full protection against SEE having first, second, third, and fourth dual CML latch cells each according to claim 20, the stage comprising: main and additional top-level differential data inputs; main and additional bottom-level differential clock inputs; main and additional differential outputs; and wherein: the data inputs of the first and second latch cells are connected together and to the main data input of the stage; the clock inputs of the first and second latch cells are connected together and to the main clock input of the stage; the data inputs of the third and fourth latch cells are connected together and to the additional data input of the stage; the clock inputs of the third and fourth latch cells are connected together and to the additional clock input of the stage; the additional input of the first latch cell is connected to the output of the fourth latch cell that serves as the additional output of the stage; the additional input of the second latch cell is connected to the output of the first latch cell; the additional input of the third latch cell is connected to the output of the second latch cell that serves as the main output of the stage; the additional input of the fourth latch cell is connected to the output of the third latch cell.

22. A dual redundant CML XOR stage with a full protection against SEE having first, second, third, and fourth dual CML XOR cells each according to claim 20, the stage comprising: main and additional top-level differential data inputs; main and additional bottom-level differential data inputs; main and additional differential outputs; and wherein: the first data inputs of the first and second XOR cells are connected together and to the main first data input of the stage; the second data inputs of the first and second XOR cells are connected together and to the main second data input of the stage; the first data inputs of the third and fourth XOR cells are connected together and to the additional first data input of the stage; the second data inputs of the third and fourth XOR cells are connected together and to the additional second data input of the stage; the additional input of the first XOR cell is connected to the output of the fourth XOR cell that serves as the additional output of the stage; the additional input of the second XOR cell is connected to the output of the first XOR cell; the additional input of the third XOR cell is connected to the output of the second XOR cell that serves as the main output of the stage; the additional input of the fourth XOR cell is connected to the output of the third XOR cell.

23. A dual CML XOR cell comprising the multiplexer cell of claim 19 wherein its first differential top-level input is inversely coupled to its second differential top-level input and represents a first XOR input, wherein its third top-level differential input represents an additional XOR input, and wherein its bottom-level input represents a second XOR input.

24. A dual redundant CML multiplexer stage with a full protection against SEE having first, second, third, and fourth dual CML multiplexer cells each according to claim 19 the stage comprising: first and second main top-level differential inputs; first and second additional top-level differential inputs; main and additional bottom-level differential inputs; main and additional differential outputs; and wherein: the first top-level inputs of the first and second multiplexer cells are connected together and to the first main top-level input of the stage; the second top-level inputs of the first and second multiplexer cells are connected together and to the second main top-level input of the stage; the bottom-level inputs of the first and second multiplexer cells are connected together and to the main bottom-level input of the stage; the first top-level inputs of the third and fourth multiplexer cells are connected together and to the first additional top-level input of the stage; the second top-level inputs of the third and fourth multiplexer cells are connected together and to the second additional top-level input of the stage; the bottom-level inputs of the third and fourth multiplexer cells are connected together and to the additional bottom-level input of the stage; the third top-level input of the first multiplexer cell is connected to the output of the fourth multiplexer cell that serves as the additional output of the stage; the third top-level input of the second multiplexer cell is connected to the output of the first multiplexer cell; the third top-level input of the third multiplexer cell is connected to the output of the second multiplexer cell that serves as the main output of the stage; the third top-level input of the fourth multiplexer cell is connected to the output of the third multiplexer cell.

* * * * *